United States Patent [19]

Aschwanden

[11] Patent Number: 5,036,293
[45] Date of Patent: Jul. 30, 1991

[54] OSCILLATOR FOR USE WITH VIDEO SIGNAL TIME SCALING APPARATUS

[75] Inventor: Felix Aschwanden, Thalwil, Switzerland

[73] Assignee: RCA Licensing Corporation, Princeton, N.J.

[21] Appl. No.: 600,635

[22] Filed: Oct. 19, 1990

[51] Int. Cl.⁵ .................. H03L 7/08; H03L 7/083; H04N 7/12

[52] U.S. Cl. .................................. 331/1; 331/18; 331/20; 358/133

[58] Field of Search ............... 331/1 A, 17, 18, 20, 331/25, 36 C; 358/133, 426; 370/109; 375/122; 381/34

[56] References Cited

U.S. PATENT DOCUMENTS

| | | | |
|---|---|---|---|
| 4,376,268 | 3/1983 | Moriya et al. | 331/11 X |
| 4,518,994 | 5/1985 | Schnitzler | 381/34 X |
| 4,623,922 | 11/1986 | Wischermann | 358/160 |
| 4,914,507 | 4/1990 | Smith et al. | 358/11 |

Primary Examiner—David Mis
Attorney, Agent, or Firm—Joseph S. Tripoli; Eric P. Herrmann; Ronald H. Kurdyla

[57] ABSTRACT

Video signal time scaling apparatus includes a gated oscillator enabled and disabled in synchronism with a line scanning rate and capable of generating an oscillatory signal which is other than a multiple of a line scanning rate. The phase of an oscillator output signal is compared to the phase of a reference signal a predetermined time after the oscillator is enabled. Phase coincidence indicates a correct oscillation frequency. Otherwise, the oscillator frequency is incremented or decremented until phase coincidence is achieved. The oscillator signal acts a READ clock for permitting a video signal to be read out of a line memory at a rate different than that at which the video signal was written into memory, thereby producing a time scaled output video signal.

9 Claims, 2 Drawing Sheets

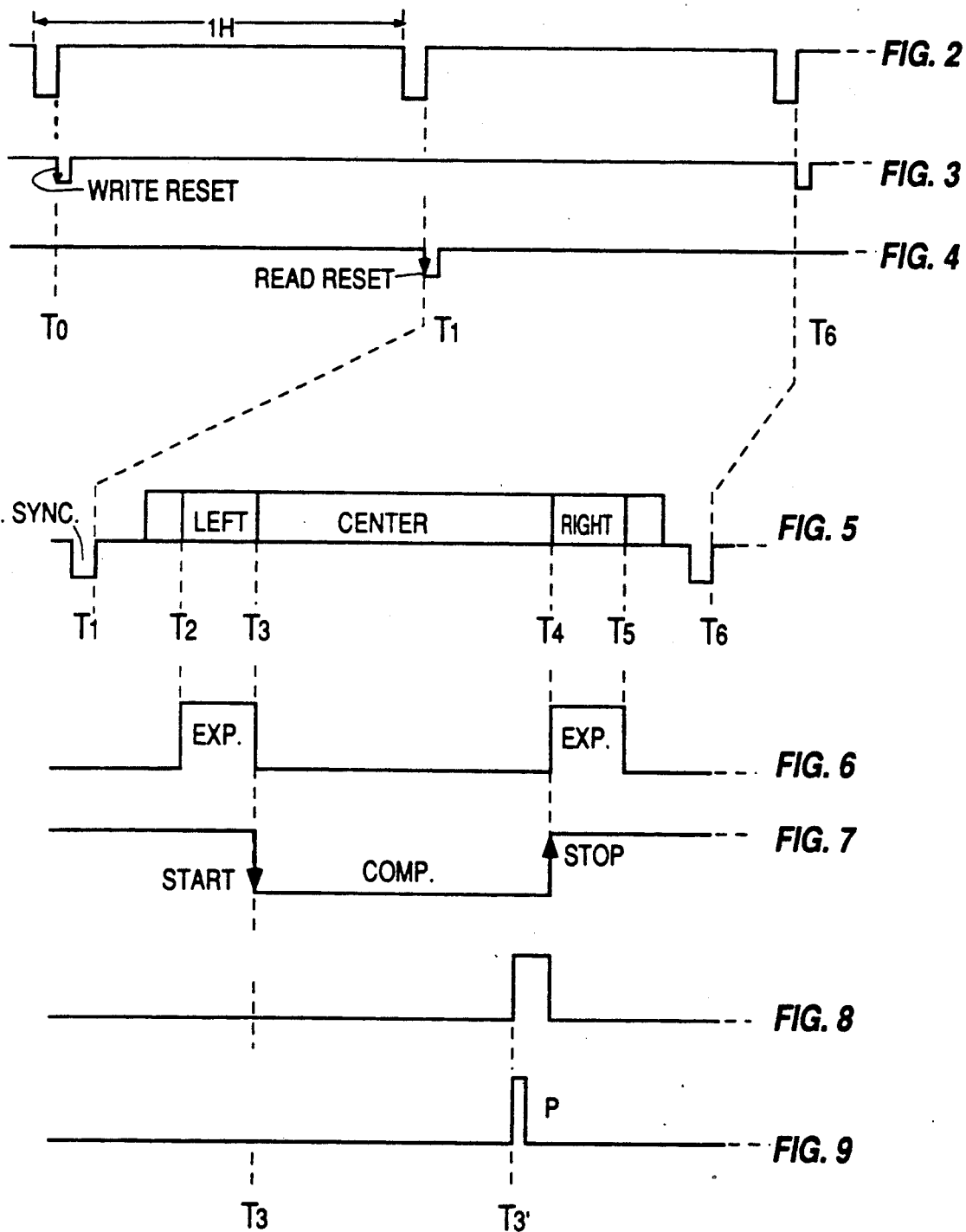

OSCILLATOR FOR USE WITH VIDEO SIGNAL TIME SCALING APPARATUS

FIELD OF THE INVENTION

This invention concerns an oscillator associated with apparatus for time scaling (e.g., compressing) a video signal such as the video component of a television signal.

BACKGROUND OF THE INVENTION

Recently there has been increasing interest in providing television receivers with more sophisticated features and signal processing capability. For example, television receivers having a widescreen display with a $5 \times 3$ or $16 \times 9$ image aspect ratio compared to a standard $4 \times 3$ image aspect ratio are being developed, as are receivers with more special effects capability. Such receivers often use special signal processing techniques such as time compression and time expansion, which can add significantly to the cost and complexity of a television receiver. It is of course desirable to keep such cost and complexity as low as possible. Consistent with this objective, a versatile, stable, uncomplicated and inexpensive time scaling network is disclosed.

SUMMARY OF THE INVENTION

Apparatus in accordance with the principles of the present invention includes a gated oscillator which provides a clock signal to a memory device to determine the rate at which video information is read out of the memory device, to produce a time scaled (e.g., compressed) video signal. A predetermined time after the oscillator is enabled during the time scaling interval, the phase of a signal derived from the oscillator output signal is compared with the phase of a reference signal to develop a difference signal. The difference signal is used to adjust the oscillator frequency.

In accordance with a feature of the invention, the oscillator frequency is other than a multiple of a line scanning rate.

In accordance with a further feature of the invention, the reference signal is generated during the latter half of the time scaling interval.

Brief Description of the Drawing

FIGS. 2-9 are signal waveforms helpful in understanding the operation of the apparatus shown in FIG. 1.

Detailed Description of the Drawing

Figure 1:
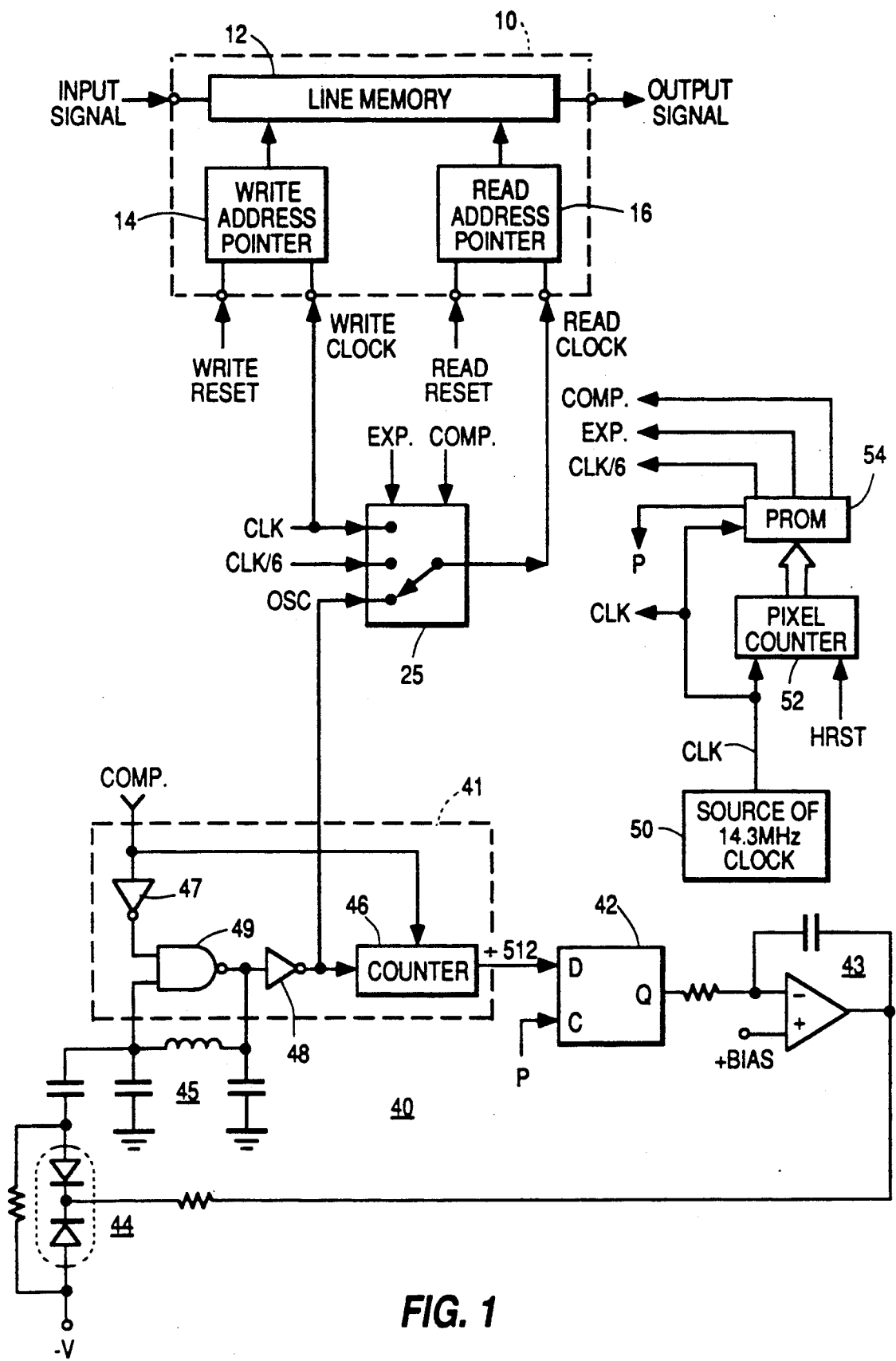
FIG. 1 is a block diagram of time scaling apparatus employing the principles of the present invention.

The time scaling apparatus to be discussed is advantageously used in a widescreen television system such as is described in U.S. Pat. No. 4,782,383 of M. A. Isnardi. Before discussing the time scaling apparatus of FIG. 1, reference is made to the widescreen television signal waveform of FIG. 5.

The widescreen, $5 \times 3$ aspect ratio, video signal waveform of FIG. 5 encompasses a single horizontal line (1H) between times T1 and T6. Time intervals T1-T2 and T5-T6 encompass image overscan and blanking intervals including a horizontal synchronizing pulse H. SYNC. Intervals T2-T3 (pixels 1-14) and T4-T5 (pixels 740-754) respectively define left and right side panel active image display regions. The main, center panel region encompasses interval T3-T4 (pixels 15-739).

FIG. 1 illustrates apparatus, sometimes referred to as raster mapping apparatus, for time compressing and expanding an input video component of a television signal. In this example the time compression and expansion is performed in the context of encoding a widescreen $5 \times 3$ aspect ratio video component so as to be compatible with the $4 \times 3$ aspect ratio format of a standard NTSC television signal. To accomplish this, the left and right side panel low frequency information in intervals T2-T3 and T4-T5 respectively are time compressed by a factor of about 6:1, high frequency side panel information is time expanded by a factor of about 4:1 and is processed separately, and the center panel information in interval T3-T4 is time expanded by a factor of 1.198. Additional details of this encoding process are found in the aforementioned Isnardi patent.

A memory unit 10 receives the input video signal and provides a time compressed or time expanded output video signal as will be discussed. A READ clock signal is applied to a read address pointer 16, and a WRITE clock signal is applied to a write address pointer 14. READ RESET and WRITE RESET signals respectively reset the read and write address pointers to an initial value at the beginning of a horizontal line. A memory 12 addressed by output signals from write address pointer 14 and read address pointer 16 is a $2048 \times 8$ bit wide memory cell array. The length of this memory, 2048 pixels, is more than two horizontal lines in a four times subcarrier NTSC television system. The input video signal is written into memory at a constant rate in response to the continuos four times NTSC subcarrier (14.31818 MHz) WRITE clock signal. The video signal is read out of memory at a higher rate (for time compression) or at a lower rate (for time expansion) one horizontal line later. In this example unit 10 is an HM 63021 memory device commercially available from Hitachi Corporation. This device exhibits independent WRITE and READ functions, which allows time compression and expansion by using different WRITE and READ clock frequencies.

FIGS. 2, 3 and 4 are timing diagrams helpful in understanding the operation of memory unit 10 in FIG. 1. A continuous 14.318 MHz clock is used as the memory WRITE clock. At a time T0, a WRITE RESET pulse (FIG. 3) resets write address pointer 14 to an initial value at the end of the horizontal synchronizing pulse interval, and data is written into a first line memory segment. Each write clock pulse increments the write pointer and addresses the memory cells appropriately. At a time T1, one horizontal line later, a READ RESET pulse resets read pointer 16. As a result data in the first line memory locations are read out and appear at the output of unit 10. Each READ clock pulse increments the read address pointer.

A wide aspect ratio horizontal line between times T1 and T6 is shown in more detail in FIG. 5. The continuous 14.318 MHz clock is applied to both the WRITE and READ clock inputs of unit 10 during intervals T1-T2 and T5-T6, whereby the input signal is neither compressed nor expanded. Time expansion of low frequency side panel information by a factor of about six occurs during left side panel interval T2-T3 and during right side panel interval T4-T5, at which times a READ clock of 2.38 MHz (14.318 MHz÷6) is employed. Time compression by a factor of 1.198 is achieved during center panel interval T3-T4 by using a READ clock of 17.153 MHz (14.318 MHz×1.198). A compression clock error of about 0.3% results from a compression clock frequency variation from 17.1 MHz to 17.2 MHz. This frequency error will produce a very small horizontal linearity error which is not visible on a displayed image. A total of 910 clock cycles are needed for each horizontal line from T1 to T6.

The video signal time expansion and compression process employs a multiplexer 25 which receives as inputs the 14.318 MHz continuous clock signal CLK, 2.38 MHz clock signal CLK/6, and a signal OSC from a compression control network 40 which will be discussed subsequently. The switching operation of multiplexer 25 is controlled by signals EXP and COMP which are illustrated in FIGS. 6 and 7 respectively. The EXP control signal causes multiplexer 25 to couple the CLK/6 signal to the READ CLOCK input of memory unit 10 during side panel intervals T2-T3 and T4-T5 when time expansion is to be performed. The COMP control signal causes the OSC signal to be applied to the READ CLOCK input of memory unit 10 during center panel interval T3-T4 when time compression is to be performed. At other times, when neither time compression nor time expansion is to be performed, multiplexer 25 couples 14.318 MHz clock signal CLK to the READ CLOCK input of unit 10.

The CLK, CLK/6, COMP and EXP signals, as well as a reference pulse P, are provided by a signal generator including a signal source 50, a pixel (picture element) counter 52 and a PROM 54 arranged as shown. Source 50, a burst locked oscillator, produces continuous 14.318 MHz clock signal CLK, which is applied to clock signal inputs of pixel counter 52 and PROM 54. Pixel counter 52 provides a 10-bit output signal, corresponding to the 910 pixel locations on each horizontal line, to PROM 54 in response to clock signal CLK. Pixel counter 52 is initialized at the beginning of each horizontal line by a horizontal reset signal HRST. PROM 54 also responds to signal CLK, and contains a look-up table which is addressed by the output signal from counter 52 so that output signals COMP, EXP, CLK/6 and P are developed at the desired times during each horizontal line interval.

Compression control network 40, which produces signal OSC used as the READ clock signal for achieving time compression, includes a gated oscillator 41. Network 40 also includes a D-type flip-flop 42 which acts as a phase detector, an integrating amplifier 43, and a variable capacitance diode 44 for determining the oscillation frequency of oscillator 41 in conjunction with an inductance-capacitance network 45. Oscillator 41 is of the phase locked loop type and advantageously can produce an oscillation signal at a frequency other than a multiple of the horizontal line scanning rate, as in the illustrated example. The oscillator signal phase is synchronized with the horizontal line rate by means of signal COMP applied to an inverter 47. In this context signal COMP additionally serves as a start-stop control signal for gated oscillator 41.

Oscillator 41 includes a counter 46 having a divide-by-512 output coupled to the D-input of flip-flop 42, inverters 47 and 48, and a logic NAND gate 49, all arranged as shown. In this example oscillator 41 is a "14-Stage Binary Ripple Counter with Oscillator", integrated circuit type 74HC4060, commercially available from Philips Corporation Semiconductor Division and from National Semiconductor, for example. Compression control signal COMP is applied to oscillator 41 for enabling (starting) and disabling (stopping) oscillator 41 as mentioned above. Oscillator output signal OSC, which serves as the compression clock, is developed at the output of inverter 48. The frequency divided (÷512) version of the oscillator output signal provided by counter 46 to phase detector 42 is shown in FIG. 8. Reference pulse P, shown in FIG. 9, is applied to the "C" clock input of flip-flop 42.

Depending on the phase of the signals applied to the "D" (Data) and "C" (Clock) inputs of phase detector 42, the output of phase detector 42 is either high or low and, after being integrated by unit 43 and applied to variable capacitance diode 44, causes the oscillator frequency to increase or decrease until the leading edges of the pulse signals applied to the inputs of phase detector unit 42 are coincident, as shown in FIGS. 8 and 9. This condition is associated with a correct oscillator frequency. A low level (logic "0") at the Q output of unit 42 causes the oscillator frequency to increase, and the D input of unit 42 will then lead clock input C in the next cycle. An opposite result occurs when a high (logic "1") level appears at the Q output of unit 42. When the leading edges of the pulse signals applied to the inputs of phase detector 42 are coincident under correct frequency conditions, the Q output of unit 42 may be high or low. As noted above, a low output causes a frequency increase and the "D" input of unit 42 will lead input C in the next cycle. As a result, the Q output of unit 42 goes high and causes a frequency decrease. However, the operating point around the desired frequency is very stable, and any phase "jitter" or variation of the D input pulse of unit 42 is only a few nanoseconds or a fraction thereof due to the low pass filtering action of integrator 43.

FIGS. 8 and 9 illustrate the timing relationship of reference pulse P and the divide-by-512 output of counter 46 when oscillator 41 is in a locked state. At this time oscillator 41 produces 724 cycles of the 17.153 MHz compression clock frequency, i.e., 1.198 compression factor ×14.318 MHz clock frequency, during the T3-T4 center panel time compression interval which includes pixels 15 to 739. After 512 oscillation cycles the divide-by-512 output of counter 46 exhibits a high logic level (i.e., a logic "1") and its phase is compared to the phase of reference pulse P by means of phase detector 42. The divide-by-512 value is not critical, and is used in this case because it was conveniently available from counter 46.

The leading edge of reference pulse P appears at a time T3', 427 cycles of the 14.318 MHz clock after the compression interval begins at time T3. Thus reference pulse P appears 29.822 microseconds (427÷14.318 MHz) after the compression interval begins. At this time, if the oscillator frequency is substantially correct, oscillator 41 will have generated 512 pulses and a pulse (FIG. 8) will be produced at the divide-by-512 output of counter 46. The oscillation frequency of compression clock signal OSC produced by unit 41 is 512÷29.822 microseconds, or 17.168 MHz, which is within the desired tolerance for the compression clock frequency. The frequency of signal OSC becomes 17.128 MHz if reference pulse P is caused to be developed 428 cycles of the 14.318 MHz clock after the compression interval begins at time T3. By this mechanism the frequency of the compression clock can be changed in steps of approximately 40 KHz. Finer frequency adjustment can be obtained by introducing an appropriate delay, e.g., zero to 70 nanoseconds, at the "D" input of flip-flop 42.

A change in the compression factor requires a change in the frequency of compression clock signal OSC and an associated change in times T3' and T4. The disclosed oscillator also can be used to develop a signal suitable for use as a time expansion clock, but in many cases it will be more convenient simply to use a frequency divided version of a pre-existing clock signal for this purpose.

In this example reference pulse P is caused to appear near the end of the center panel interval over which time compression occurs. However, reference pulse P can be caused to appear earlier in the center panel interval. Having reference pulse P appear near the end of the center panel compression interval advantageously permits finer frequency resolution to be achieved. For example, as discussed previously, an oscillation frequency of 17.168 MHz is obtained when reference pulse P is caused to appear 427 cycles of the 14.318 MHz clock after the compression interval begins. A slightly lower frequency of 17.128 MHz is obtained when pulse P appears 428 cycles of the 14.318 MHz clock after the compression interval begins. The fine frequency resolution of the oscillator is therefore 40 KHz (17.168 MHz–17.128 MHz). If reference pulse P occurs earlier in time within the compression interval, e.g., after 100 cycles of the 14.3 MHz clock signal, a coarser resolution of 171 KHz results (i.e., 427/100×40 KHz).

As mentioned above, control network 40 including gated oscillator 41 advantageously can produce a variety of oscillation frequencies including a frequency other than a multiple of a horizontal line scanning frequency. The control network including oscillator 41 exhibits frequency stability and is uncomplicated. Only a single flip-flop is used as phase detector 42, interpolators are not required, and a specific divide-by-N frequency divider for providing a frequency divided signal at a specific frequency, as is found in many conventional PLL oscillator networks, also is not required.

Compression control network 40 including oscillator 41 can be associated with a signal encoding process, or with a signal decoding process such as may be found in a television receiver. The use of control network 40 in a consumer television receiver is particularly attractive because network 40 is uncomplicated and inexpensive.

Multiplexer 25 can be an integrated circuit type 74HC151, and flip-flop phase detector 42 can be an integrated circuit type 74HC74, both available from Philips Semiconductor and from National Semiconductor.

What is claimed is:

1. Apparatus for time scaling a video signal, comprising:
    memory means having an input for receiving said video signal, an output for providing a time scaled video signal, a first clock input for receiving a first clock signal to determine a first rate at which said video signal is written into said memory means, a second clock input for receiving a second clock signal to determine a second rate at which said video signal is read out of said memory means, in time scaled form;
    an oscillator for producing said second clock signal during a time scaling interval and having a frequency control input;
    means for generating a reference signal at a predetermined time within of said time scaling interval;
    phase detector means for generating a difference signal representative of a phase difference between said reference signal and a signal derived from said second clock signal produced by said oscillator; and
    means for applying said difference signal to said frequency control input of said gated oscillator.

2. Apparatus according to claim 1, wherein said oscillator is a gated oscillator enabled during said time scaling interval and disabled at other times.

3. Apparatus according to claim 1, wherein said second clock signal is a time compression clock for producing a time compressed video signal at said output of said memory means.

4. Apparatus according to claim 1, wherein said reference signal is generated during the latter half of said time scaling interval.

5. Apparatus according to claim 2, wherein said gated oscillator is enabled in synchronism with a line scanning rate; and
said second clock signal is other than a multiple of a horizontal line scanning rate.

6. Apparatus according to claim 1 and further comprising:
    a network for integrating an output signal from said phase detector means; and
    a variable impedance network responsive to an output signal from said integrating network for providing a control signal to said frequency control input of said oscillator.

7. Apparatus according to claim 6, wherein said reference signal is developed during the latter half of said time scaling interval.

8. Apparatus according to claim 6, wherein said derived signal is a frequency divided version of said second clock signal.

9. Apparatus according to claim 1 and further comprising
    means for generating a third clock signal for providing time scaling of a type different than time scaling provided by said second clock signal;
    switching means for conveying said second clock signal to said memory means during said time scaling interval, for conveying said third clock signal to said memory means when said time scaling of said different type is to be performed, and for conveying said first clock signal to said memory means at other times.

* * * * *